United States Patent
Penaflor et al.

(10) Patent No.: US 11,662,365 B2
(45) Date of Patent: May 30, 2023

(54) SYSTEMS AND METHODS FOR DETECTING FORCER MISALIGNMENT IN A WAFER PROBER

(71) Applicant: Microchip Technology Incorporated, Chandler, AZ (US)

(72) Inventors: Sherwin Penaflor, Cavite (PH); Lester Tipano, Calamba (PH); Gerald Paul Margallo, Davao (PH)

(73) Assignee: Microchip Technology Incorporated, Chandler, AZ (US)

( * ) Notice: Subject to any disclaimer, the term of this patent is extended or adjusted under 35 U.S.C. 154(b) by 212 days.

(21) Appl. No.: 17/147,778

(22) Filed: Jan. 13, 2021

(65) Prior Publication Data

US 2022/0082589 A1    Mar. 17, 2022

Related U.S. Application Data

(60) Provisional application No. 63/079,586, filed on Sep. 17, 2020.

(51) Int. Cl.
  *G01R 1/067*  (2006.01)
  *G01R 31/28*  (2006.01)
(52) U.S. Cl.
  CPC ..... *G01R 1/06794* (2013.01); *G01R 31/2831* (2013.01)
(58) Field of Classification Search
  None
  See application file for complete search history.

(56) References Cited

U.S. PATENT DOCUMENTS

| | | | |
|---|---|---|---|
| 3,996,517 A | 12/1976 | Fergason et al. | 324/750.19 |
| 5,321,267 A | 6/1994 | Song et al. | 250/349 |
| 7,183,759 B1* | 2/2007 | Malendevich | G02B 6/34 324/762.05 |
| 2003/0085723 A1* | 5/2003 | Martens | G01R 1/07342 324/754.07 |
| 2006/0071679 A1 | 4/2006 | Gibbs et al. | 324/750.22 |
| 2007/0235133 A1* | 10/2007 | Benassi | B24B 37/013 438/692 |

OTHER PUBLICATIONS

International Search Report and Written Opinion, Application No. PCT/US2021/016510, 15 pages, dated May 31, 2021.

* cited by examiner

*Primary Examiner* — Douglas X Rodriguez
(74) *Attorney, Agent, or Firm* — Slayden Grubert Beard PLLC

(57) ABSTRACT

A system is provided for detecting a forcer misalignment, e.g., due to forcer loss of registration (FLR), in a wafer prober used for electrical testing of a semiconductor wafer. The system includes an optical sensor system including a transmitter and receiver affixed to the forcer or to a reference structure (e.g., the prober platen), and a reflector affixed to the other one of the forcer or reference structure. The transmitter emits radiation toward the reflector, which reflects the radiation toward the receiver. The receiver detects the reflected radiation, and generates an output signal indicating the quantity of received radiation. Alignment monitoring circuitry is configured to identify a misalignment of the forcer relative to the reference structure (e.g., platen) based on the output signal generated by the receiver, and in response, output an alert signal, e.g., to suspend operations of the prober and/or display an error notification to an operator.

16 Claims, 9 Drawing Sheets

SYSTEMS AND METHODS FOR DETECTING FORCER MISALIGNMENT IN A WAFER PROBER

RELATED APPLICATION

This application claims priority to commonly owned U.S. Provisional Patent Application No. 63/079,586 filed Sep. 17, 2020, the entire contents of which are hereby incorporated by reference for all purposes.

TECHNICAL FIELD

The present disclosure relates to generally to semiconductor development and manufacturing, and more particularly, to systems and methods for detecting a misalignment of a forcer in a wafer prober used for electrical testing of a semiconductor wafer.

BACKGROUND

A wafer prober may be used for electrical testing of wafers in a semiconductor development and manufacturing process. During an electrical test of a wafer, test signals from a measuring instrument or tester are transmitted to individual devices on the wafer via probing needles or a probe card, and the signals are then returned from the device. The function of the wafer prober is to precisely position and reposition the wafer to allow the probing needles or probe card to make contact at specified locations on the wafer to perform the relevant electrical testing.

FIG. 1A shows a conventional wafer prober system. FIG. 1B shows an enlarged view of a portion of the wafer prober supporting the semiconductor wafer to be tested. As shown in FIGS. 1A and 1B, a semiconductor (e.g., silicon) wafer is supported on a chuck assembly, which is mounted on a movable forcer arranged on a base, or platen. The forcer is held off the platen top surface by an air bearing, and moved across the platen surface (along x and y axes) by suitable control circuitry, in order to precisely position the wafer relative to the probing needles or probe card for specified electrical tests. The forcer carries the chuck, which may raise or lower the wafer (along the z axis) to bring the wafer into and out of contact with the probing needles or probe card.

During the development of semiconductor devices, a wafer prober is often mainly for evaluating the characteristics of prototype integrated circuits (ICs), reliability evaluation, and defect analysis. The prober may be used for highly accurate measurement and evaluation of a test element group (TEG), comprising transistors, interconnections and other element devices for an IC. During production testing, e.g., for mass production of semiconductor devices, the prober may be used for TEG testing for process monitoring and electrical testing of IC chips. In both development and production testing, electrical noise and signal leakage should be minimized. In addition, the wafer must be precisely positioned relative to the probing needles or probe card for various electrical tests. Thus, the movement and position of the forcer must be controlled accurately and precisely.

However, in a typical prober, the forcer may become misaligned relative to an intended position or orientation of the forcer, causing the semiconductor wafer to be misaligned relative to the probing needles or probe card, which may cause testing errors and may also damage the probing needles/probe card and scratch the wafer. Misalignment of the forcer may be referred to as "loss of registration" or "forcer loss of registration" or simply "FLR." A typical wafer prober is unable to detect a misalignment of the forcer (FLR). Damaged probe cards resulting from FLR remains a substantial cost, if not the largest cost, in many wafer probe operations.

The proper alignment of the forcer may be defined relative to the platen. Misalignment of the forcer typically involves a rotational misalignment relative to the platen, but may also include translational misalignment (e.g., along the x-axis or y-axis) relative to the platen. Forcer misalignment may be caused by FLR, e.g., due to a failure or problem with the air bearing (analogous to a maglev system) between the forcer and underlying platen, which may result from various different causes. For example, the forcer may become warped over time, e.g., the bottom surface of the forcer may become mechanically uneven or non-planar. As another example, the air bearing (air gap) between the forcer bottom surface and platen surface may be lower or higher than the specification distance. As yet another example, air orifice(s) at the bottom of the forcer may become clogged, or an insufficient clean dry air (CDA) supply, may provide an insufficient or imbalanced air lift to the forcer. As another example, the umbilical cable providing electrical signals to the forcer magnetic coils may become damaged, causing an electrical fault, or may become restricted, thus preventing free movement of the forcer. Further, a defective power supply may provide an improper voltage to the forcer magnetic coil power. As another example, the Digital to Analog Resolver (DAR) board for driving the forcer magnetic coil may be defective. As another example, improper use or maintenance of the prober may result in FLR conditions. Finally, a foreign object may interfere with the free movement of the forcer.

Some existing probers are configured to set a maximum height (z-height) of the chuck assembly during a wafer profiling and cleaning process, to help avoid damages resulting from a specific FLR scenario. By setting a maximum chuck z-height during wafer profiling/cleaning process, if the forcer loses registration during this process, e.g., due to a failed air bearing between the forcer and platen, the prober sets a maximum chuck z-height that is artificially low, as compared with the maximum z-height corresponding with a properly functioning air bearing (i.e., no FLR). During a subsequent testing process using the prober experiencing FLR, the erroneously low maximum chuck z-height may prevent the wafer from being raised into contact the probe card, to thereby protect the probe card from damage. However, this protective technique is effective only for an FLR that occurs or exists during the wafer profiling/cleaning process; the technique does not provide protection for an FLR or forcer misalignment that occurs after the wafer profiling/cleaning process, e.g., during an electrical testing process.

There is a need for systems and methods for automated detection of a forcer misalignment in a wafer prober, e.g., due to FLR, and/or automated control of the prober to suspend operation to avoid damage to the probing needles/probe card or the wafer itself due to the forcer misalignment.

SUMMARY

Embodiments of the present invention provide systems and methods for detecting a forcer misalignment in a wafer prober used for electrical testing of a semiconductor wafer. The forcer misalignment may involve a rotational and/or translational misalignment of the forcer relative to a reference structure, e.g. the prober platen grid, due to an FLR event or condition.

Some embodiments provide an upgrade kit to be installed on an existing production equipment. The kit may include circuitry that uses an optical sensor system to automatically detect a forcer misalignment (e.g., due to FLR) and cause the prober to stop operation. In some embodiments, the upgrade kit may be installed and used on Electroglas EG4090 and EG2001X Probers.

Embodiments of the invention may help address the equipment design shortcoming which is a factor to high operation cost. Stopping the equipment when FLR occurs may prevent damage to expensive probe cards, thus reducing overall wafer probe operational costs. Embodiments of the invention may also improve operational performance due to reduced shutdowns.

Some embodiments provide an automated system for monitoring the alignment of a wafer prober forcer. The system may include an optical sensor system including (a) a transmitter and receiver positionally affixed to either (i) the forcer or (ii) a reference structure that does not move with the forcer, e.g., the prober platen) and (b) a reflector affixed to the other one of the forcer or reference structure. The transmitter is configured to transmit radiation (e.g., an infrared beam or laser beam) toward the reflector, which reflects the radiation toward the receiver. The receiver is configured to receive the reflected radiation from the reflector, which includes at least a portion of the radiation transmitted by the transmitter, and generate an output signal as a function of the reflected radiation received at the receiver (e.g., indicating a measure of the received radiation).

The system may further include alignment monitoring circuitry (e.g., including suitable hardware, firmware, and/or software) configured to monitor an alignment of the forcer relative to the reference structure based on the output signal generated by the optical sensor system receiver. Based on such monitoring, the alignment monitoring circuitry may identify a misalignment of the forcer relative to the reference structure, output an alert signal in response to the identified forcer misalignment, e.g., for displaying an error notification and/or suspending an operation of the wafer prober to thereby prevent damage to the prober (e.g., the probing needles or probe card) and/or the semiconductor wafer.

As used herein, an element is "positionally affixed" to another element if the element remains fixed and stationary with respect to the other element. An element may be positionally affixed to another element by a direct or indirect connection of the elements.

The transmitter of the optical sensor system may be configured to emit any suitable type of radiation according to any suitable emission parameters. For example, the transmitter may be configured to emit any wavelength of electromagnetic radiation, e.g., infrared radiation, visible light, or ultraviolet light. In some embodiments, the transmitter may be configured to emit an infrared beam. In other embodiments, the transmitter may comprise a laser device, e.g., a laser diode, configured to emit a laser beam. Further, the transmitter may be configured to collimated radiation (e.g., a laser beam) or non-collimated radiation. Further, the transmitter may be controlled (by suitable control electronics of the optical sensor system or alignment monitoring circuitry) to emit radiation according to any suitable timing parameters or protocol, e.g., at a defined frequency or in response to defined triggering events (e.g., a controlled movement of the forcer initiated by the prober control electronics). In some embodiments, the optical sensor system may include any suitable type(s) and number of optical elements (optics), e.g., one or more lens, filter, window, prism, polarizer, beam splitter, waveguide, wave plate, or fiber optics.

In some embodiments, the transmitter and receiver of the optical sensor system are affixed to the reference structure (e.g., platen), and the reflector is affixed to the forcer or other component positionally affixed to the forcer (e.g., the chuck assembly). For example, as shown in the example embodiment of FIG. 3, discussed below, the transmitter and receiver may be arranged together and positionally affixed to the prober platen, and the reflector may be a planar strip or reflective material (e.g., mirror) positionally affixed to the forcer. In other embodiments, the arrangement of the transmitter, receiver, and reflector may be reversed. That is, in some embodiments the transmitter and receiver are positionally affixed to the forcer or a component positionally affixed to the forcer (e.g., the chuck assembly), and the reflector is affixed to the reference structure (e.g., platen).

In some embodiments, the alignment monitoring circuitry may be configured to identify forcer misalignments (e.g., due to FLR) by identifying movements or alignments of the forcer (relative to the platen or other reference structure) that are not intended or expected during normal operation of the prober. For example, during a normal operation of the prober, control electronics of the prober may control the forcer to translate along at least one axis (e.g., x and y axes of a horizontal x-y plane) relative to the platen, and further control the forcer to raise and lower the chuck assembly (z-axis movement) to bring the wafer into and out of contact with the probing needles or probe card. In some embodiments, the alignment monitoring circuitry may detect a forcer misalignment by identifying a rotational movement of the forcer (in the horizontal x-y plane) relative to the platen or other reference structure. Thus, the transmitter, receiver, and reflector of the optical sensor system may be arranged such that the amount of reflected radiation (emitted by the transmitter) received at the receiver is dependent on the rotational position of the forcer (in the horizontal x-y plane) relative to the platen or other reference structure. An example of such configuration is discussed below with reference to the example embodiment shown in FIG. 3.

The alignment monitoring circuitry may be configured to identify forcer misalignments (e.g., resulting from FLR) by analyzing one or more parameters of radiation received at the optical sensor receiver. Such parameters may include, for example, magnitude (quantity), wavelength, frequency, timing, and/or angle of incidence of the received radiation. For example, the receiver may convert received radiation into electronic signals representing a magnitude of received radiation, and the alignment monitoring circuitry may compare the detected magnitude of received radiation to one or more threshold values. In one embodiment, the alignment monitoring circuitry may identify a forcer misalignment condition when the detected magnitude of received radiation exceeds a defined threshold value.

As noted above, the alignment monitoring circuitry may be configured to output an alert signal in response to identifying a forcer misalignment to reduce or prevent damage to the prober and/or wafer being tested. Such output may be used to control a display device to display an alert notification, e.g., indicating a forcer misalignment condition or indicating a general error condition. In addition or alternatively, the alignment monitoring circuitry may be configured to suspend an operation of the wafer prober in response to identifying a forcer misalignment. For example, the alignment monitoring circuitry may stop all operations of the prober. As another example, the alignment monitoring circuitry may suspend selected operations, e.g., raising or lowering of the chuck, or any movement of the prober.

BRIEF DESCRIPTION OF THE FIGURES

A more complete understanding of the present disclosure may be acquired by referring to the following description taken in conjunction with the accompanying drawings wherein.

DETAILED DESCRIPTION

Embodiments of the invention provide systems and methods for detecting a forcer loss of registration (FLR) in a wafer prober. An optical sensor system is configured to monitor the alignment of the forcer relative to a reference structure (e.g., prober platen) over time. In some embodiments, a transmitter affixed to the reference structure emits radiation toward a reflector affixed to the forcer, which reflects the radiation toward a receiver affixed to the reference structure. In other embodiments, the transmitter and receiver are affixed to the forcer, and the reflector is attached to the reference structure. In either configuration, the receiver detects the reflected radiation, which includes a portion of the radiation emitted by the transmitter, and generates an output signal indicating the quantity of received radiation. Alignment monitoring circuitry may be configured to identify a misalignment of the forcer relative to the reference structure based on the output signal generated by the receiver, and in response, output an alert signal, e.g., to suspend operations of the prober and/or display an error notification to an operator.

Figure 1A:
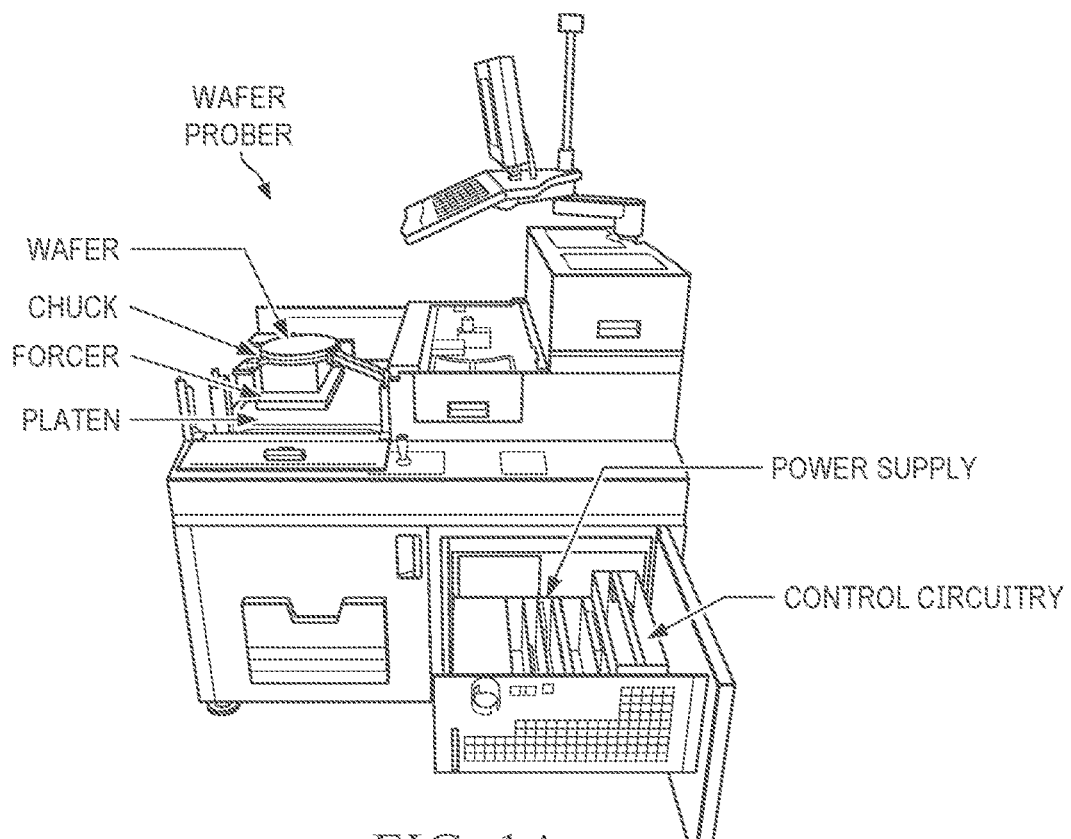
FIG. 1A shows a conventional wafer prober system.
Figure 1B:
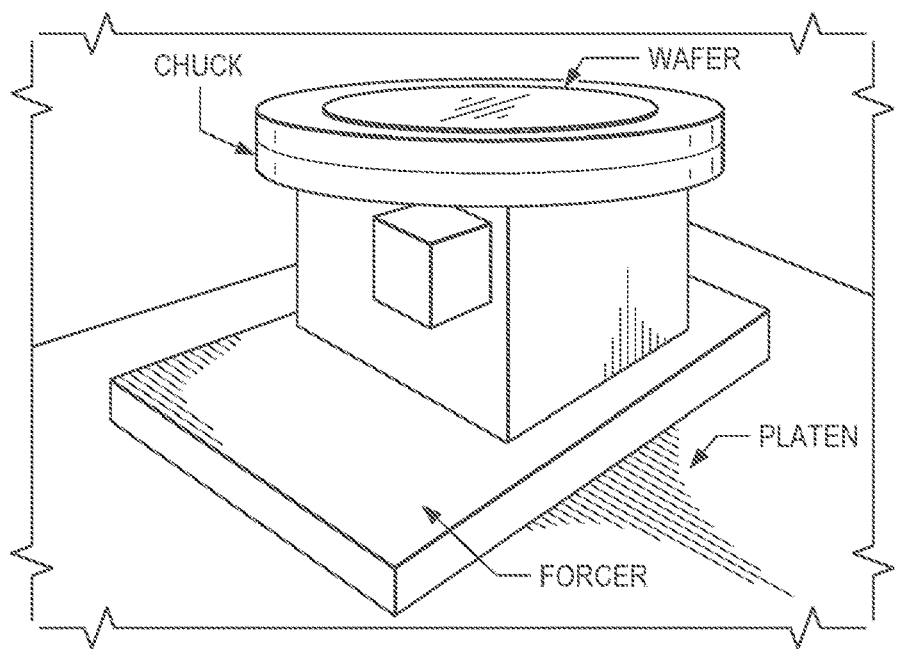
FIG. 1B shows an enlarged view of a selected portion of the wafer prober shown in FIG. 1A.
Figure 2:
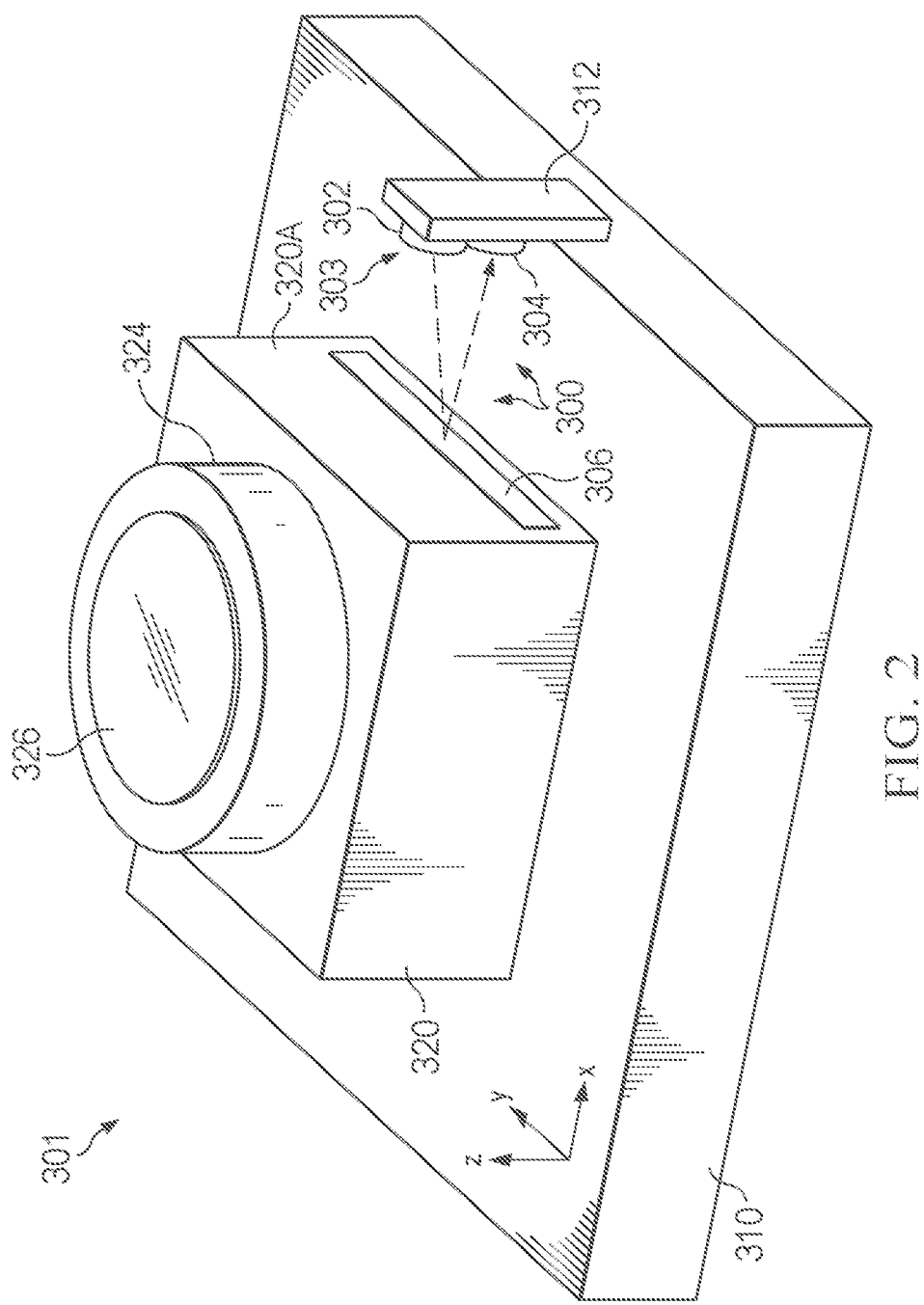
FIG. 2 illustrates an example optical sensor system of a forcer alignment monitoring system provided for a wafer prober, according to one embodiment of the invention.

FIG. 2 illustrates an example optical sensor system 300 of a forcer alignment monitoring system provided for a wafer prober 301, according to one embodiment of the invention. As shown, the optical sensor system 300 includes an optical sensor head 303 including (a) a transmitter 302 and a receiver 304 positionally affixed to the wafer prober platen 310 by a sensor mounting structure 312, and (b) a reflector 306, in particular a planar mirror strip, affixed to the wafer prober forcer 320, which carries a chuck assembly 324 that supports a semiconductor wafer, as discussed above. Transmitter 302 and receiver 304 may comprise fiber optic devices (e.g., as shown in the example embodiment of FIG. 3, discussed below) or any other type of transmitter and receiver configured to emit and receive electromagnetic radiation. The transmitter 302 and receiver 304 may be arranged such that an emitting aperture 302A of the transmitter is located below a receiving aperture 304A of the receiver 304. In other embodiments, the transmitter 302 and receiver 304 may be arranged relative to each other in any other manner (e.g., vertically aligned over each other, or laterally side-by-side).

The transmitter 302 may be configured to emit an infrared beam (emitted radiation) toward the mirror strip 306, which reflects at least a portion of the emitted radiation (e.g., a portion of the emitted radiation that is incident on the mirror strip 306) back toward the 304 (reflected radiation). A portion of the reflected radiation is incident on the receiver aperture 304A and may thus be detected and measured. The portion of the reflected radiation, which comprises a portion of the emitted radiation, that is incident on the receiver aperture 304A and thus detectable by receiver 304 may depend on a number of factors, including for example, (a) the beam diameter or radius at a plane of the receiver aperture 304A, (b) the position of the receiver aperture 304A relative to the radiation, e.g., relative to a central beam axis at a plane of the receiver aperture 304A, (c) a convergence, divergence, focal point, and/or other beam parameters of the emitted radiation, (d) the reflective properties of mirror strip 306, (e) the path length of radiation from the transmitter aperture 302A to the mirror strip 306 and back to the receiver aperture 304A (e.g., based on the current position of the forcer along the x-axis, (f) the angle of the planar reflective surface of mirror strip 306 relative to the transmitter aperture 302A and the receiver aperture 304A, without limitation.

In the illustrated example, the planar mirror strip (reflector) 306 is arranged on a surface 320A of the forcer 320 that is parallel with the y-axis movement direction of the forcer. In addition, the transmitter 302 is arranged such that a central beam axis of the emitted radiation is perpendicular (normal) to the planar surface of the mirror strip 306, or approximately perpendicular (normal) to the planar surface of the mirror strip 306 (e.g., <1 degree, <3 degrees, <5 degrees, or <10 degrees from normal, depending on the embodiment). With this configuration, y-axis translation (without rotation) of the forcer 320 relative to the platen 310 has little or no affect on the radiation received at the receiver 304, such that y-axis translation of the forcer 312 does not cause the alignment monitoring circuitry to identify a misalignment of the forcer 312. In addition, x-axis translation (without rotation) of the forcer 312 relative to the platen 310 may also have a relatively small affect on the radiation received at the receiver 304, such that x-axis translation of the forcer 312 also does not cause the alignment monitoring circuitry to identify a misalignment of the forcer 312.

Figure 3:
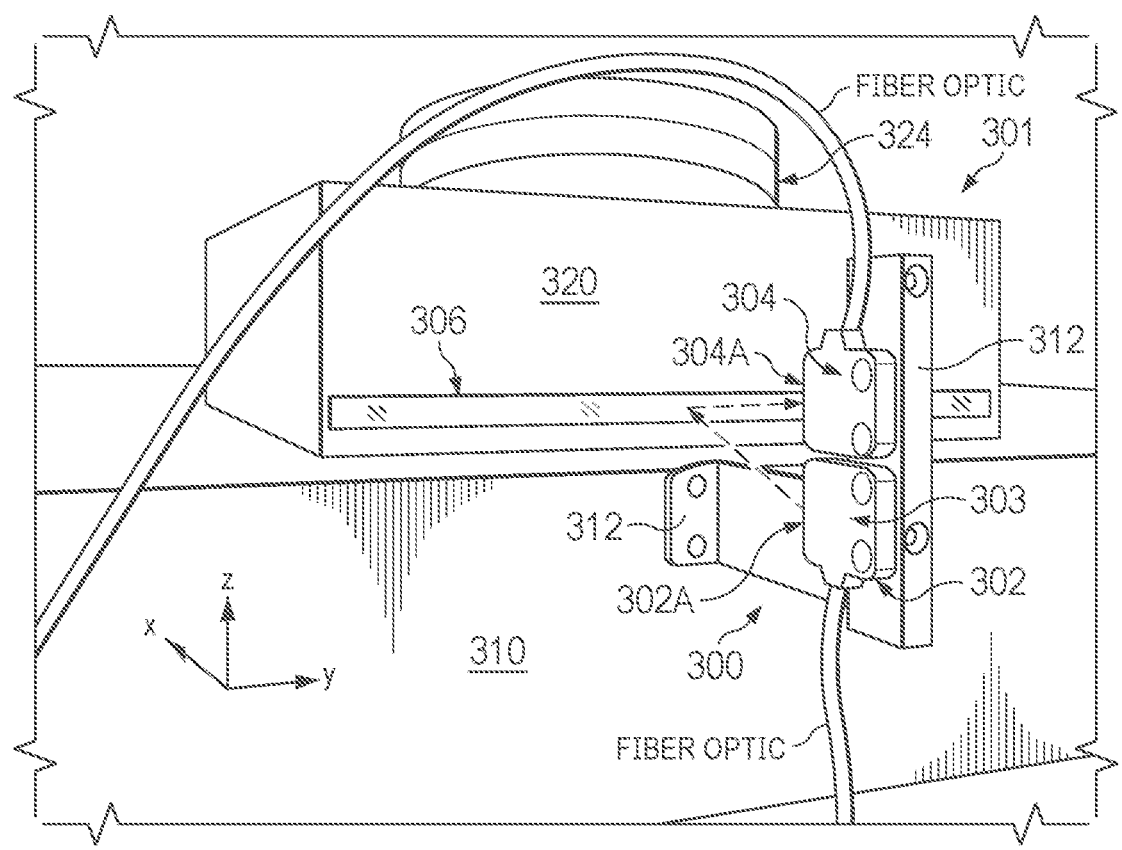
FIG. 3 is an image of an example optical sensor system of a forcer alignment monitoring system, including a fiber optic transceiver and fiber optic receiver, according to one embodiment of the invention.

FIG. 3 is an image of one example embodiment of the optical sensor system 300 shown in FIG. 2. In this embodiment, the transmitter 302 and receiver 304 comprise fiber optic devices terminating at an optical sensor head 303 affixed to a sensor mounting structure 312 that is in turn affixed to the prober platen 310.

Figure 4:
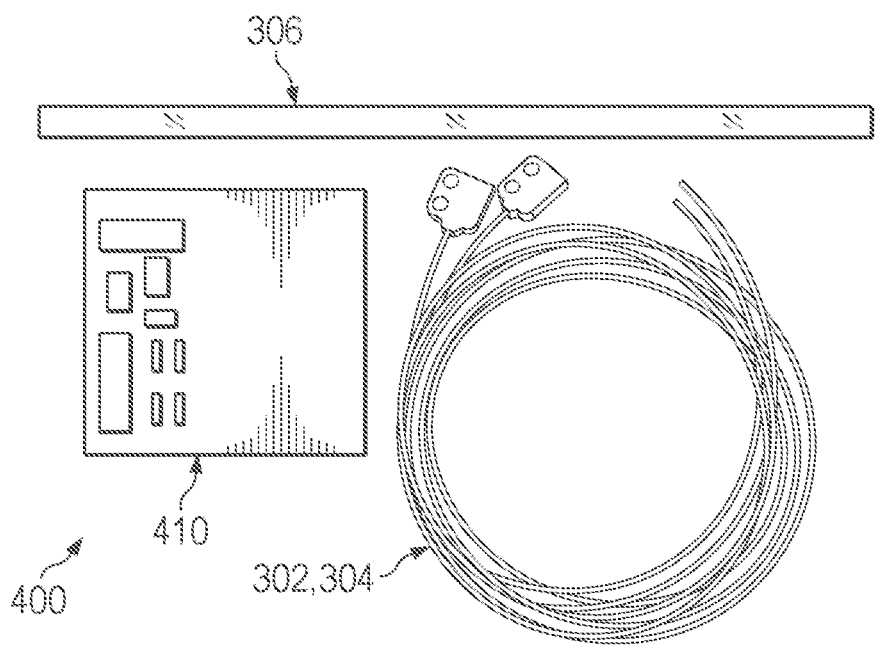
FIG. 4 is an image of an example forcer alignment monitoring system that can be installed on an existing wafer prober, according to one embodiment of the invention.

FIG. 4 shows an example forcer alignment monitoring system 400 that can be installed (e.g., retrofit) on an existing wafer prober, according to one embodiment of the invention. As shown, the example forcer alignment monitoring system 400 includes the components of the optical sensor system 300 shown in FIG. 3, including a fiber optic transmitter 302 and fiber optic receiver 304 and reflector (mirror strip) 306, along with alignment monitoring circuitry 410 provided on a printed circuit board (PCB).

FIGS. 5A-5D illustrate an example operation of optical sensor system 300 shown in FIG. 2 (or FIG. 3) for monitoring and detecting a misalignment of the forcer 310, according to one example embodiment. Each FIG. 5A-5D shows a top view of relevant components, including the forcer 320 arranged on the platen 310, with a mirror strip 306 positionally affixed to the forcer 320 and sensor head 303 including an infrared beam transmitter 302 and receiver 304 positionally affixed to the platen 310 by a mounting structure 312. Although transmitter 302 and receiver 304 are arranged one above the other in the z-axis direction as shown in FIG. 3, transmitter 302 and receiver 304 are shown side-by-side in the y-axis direction in FIGS. 5A-5D to better illustrate the principles of the forcer misalignment detection.

Figure 5A:
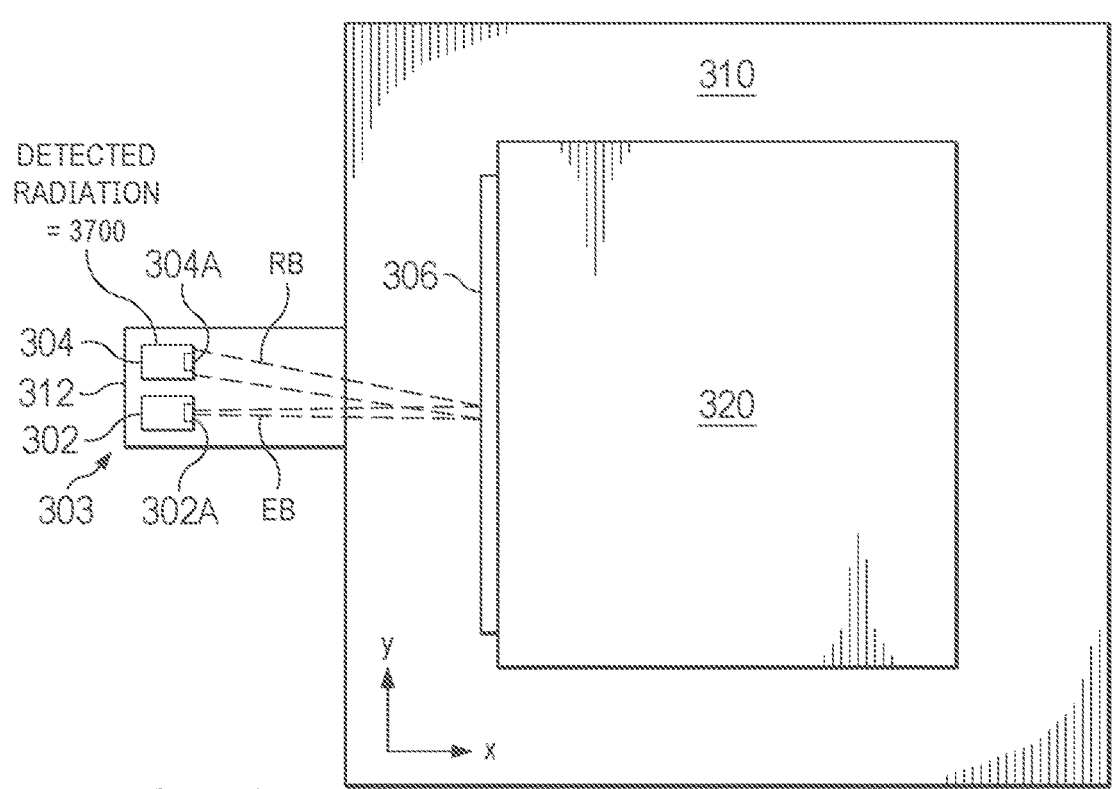
FIGS. 5A-5D illustrate an example operation of optical sensor system shown in FIG. 2 or FIG. 3 for monitoring and detecting a misalignment of the forcer, according to one example embodiment.

FIG. 5A shows the forcer 320 in a "home" position. Fiber optic transmitter 302 emits an infrared beam toward mirror strip 306, indicated as emitted beam EB. The portion of the emitted beam EB that is incident on the mirror strip 306 (which may include all, some, or none of the emitted beam EB) is reflected back toward the receiver 304, indicated as reflected beam RB. In the home position of the forcer 320, a central axis of the reflected beam RB is aligned with the receiver aperture 304A. Circuitry of the alignment monitoring system may generate an incident radiation value representing the quantity (magnitude) of radiation incident at the receiver aperture 304A, and compare the incident radiation value with at least one threshold value to detect a forcer misalignment condition, as discussed herein. For example, the detection circuitry may compare the incident radiation value with a threshold value of 50, wherein a forcer misalignment is detected if the incident radiation value is below the threshold value of 50. As shown in FIG. 5A, in the properly aligned position of the forcer 320, the detection circuitry may determine an incident radiation value of 3700 (relative to a maximum value of 4000).

Figure 5B:
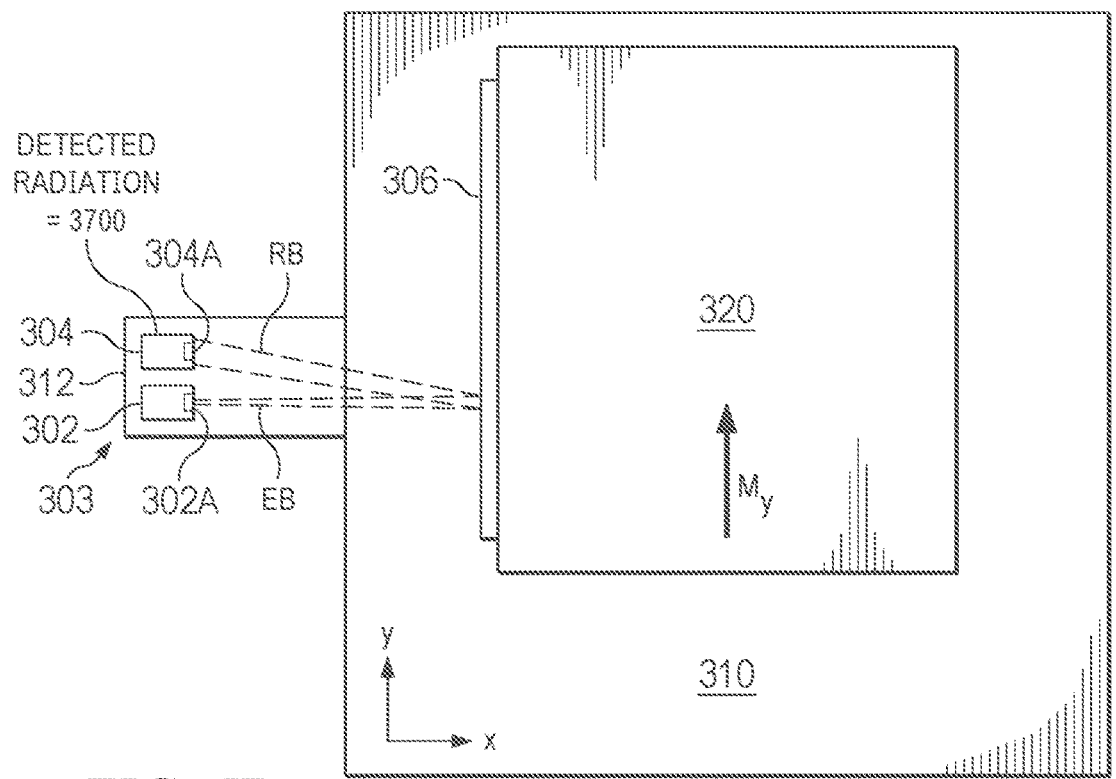

FIG. 5B shows the forcer 320 moving or moved along the y-axis direction, indicated at $M_x$. As shown, this translation of forcer 320 does not affect the position or orientation of the mirror strip 306 relative to the incoming emitted beam EB, and thus the quantity (magnitude) of reflected beam RB received at the receiver 304 is substantially the same (detected magnitude=3700) as the home position scenario shown in FIG. 5A. Thus, the alignment monitoring system does not detect a misalignment of forcer 320.

Figure 5C:
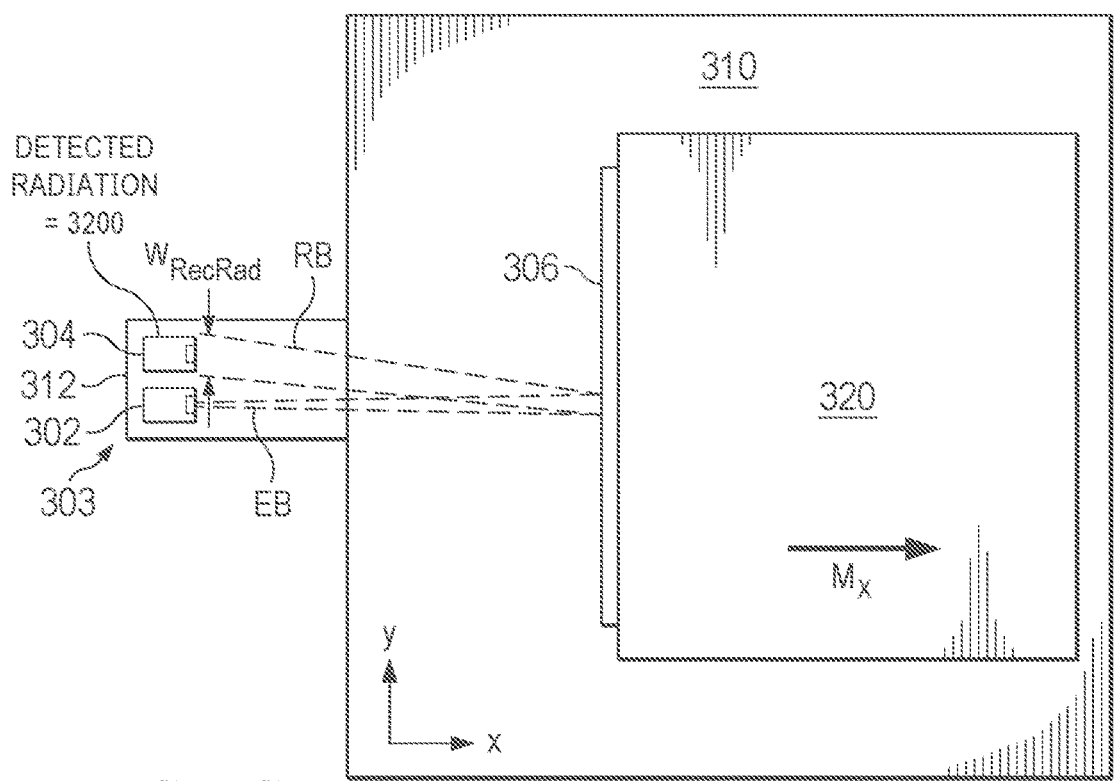

FIG. 5C shows the forcer 320 moving or moved along the x-axis direction away from the transmitter 302 and receiver 304, indicated at $M_y$. As shown, this translation of forcer 320 increases the beam path length, from transmitter 302 to receiver 304, but does not significantly affect the alignment of the central axis of the reflected beam RB with the receiver aperture 304A, assuming the emitted beam EB and reflected beam RB are very close to perpendicular (normal) with the reflective surface of mirror strip 306. Similarly, a x-axis translation toward the transmitter 302 and receiver 304 (i.e., opposite the illustrated movement direction $M_y$) decreases the beam path length from transmitter 302 to receiver 304, but does not significantly affect the alignment of the central axis of the reflected beam RB with the receiver aperture 304A.

The changes in the beam path length (from transmitter 302 to receiver 304) resulting from x-axis movements of the forcer 320 may affect the quantity (magnitude) of reflected beam RB received at the receiver 304. For example, increasing or decreasing the beam path length may increase or decrease the amount of the emitted beam EB incident on and reflected by the mirror strip 306. Further, increasing or decreasing the beam path length may increase or decrease the beam width or diameter of the reflected beam RB incident at the plane of the receiver aperture 304A. For example, for a divergent reflected beam RB, the beam width at the plane of the receiver aperture, indicated in FIG. 5C as $W_{RecRad}$, increases with increased beam path length, e.g., as the forcer 320 moves away from transmitter 302/receiver 304 in the x-axis direction.

In the example shown in FIG. 5C, the increased beam width $W_{RecRad}$ reduces the quantity (magnitude) of reflected beam RB received at the receiver 304 from 3700 (FIGS. 5A and 5B) to 3200.

In some embodiments, the threshold value(s) of detected incident radiation at receiver 304 may be selected such that changes in detected quantity of radiation resulting from y-axis (and non-rotational) translation of the forcer 320 do not trigger a detection of a forcer misalignment condition. For example, testing of the system may determine that x-axis movement of the forcer 320 results in a detected range of incident radiation values of 2500-4000. In response, a threshold value of less than 2500 may be set for detecting a forcer misalignment, such that x-axis translations do not trigger a forcer misalignment detection. In the illustrated embodiment, the incident radiation threshold value is set at 100, for clean detection of a forcer misalignment with minimal false positives. Thus, because the detected radiation at receiver 304 is 3200 (above the threshold value of 100), the alignment monitoring system does not detect a misalignment of forcer 320 for the position shown in FIG. 5C.

Figure 5D:
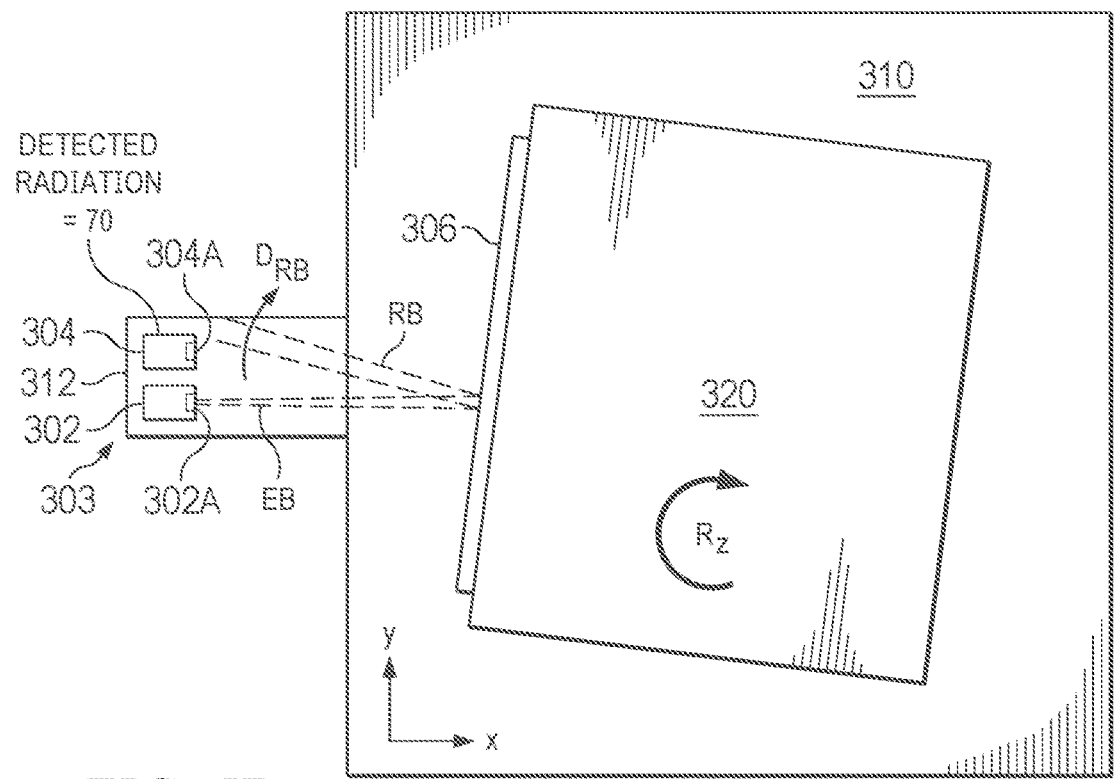

Finally, FIG. 5D shows a misalignment of forcer 320 in the form of a rotation in the x-y plane, i.e., a rotation about the z-axis, indicated at $R_z$. As shown, this rotation of forcer 320 causes a rotational deflection of the reflected beam RB, as indicated by the arrow $D_{RB}$. This deflection of the reflected beam RB reduces the alignment of the central axis of beam RB relative to the receiver aperture 304A, which reduces the quantity (magnitude) of reflected beam RB received at the receiver 304, by an amount related to the degree of deflection $D_{RB}$ of beam RB. In the illustrated example, the detection circuitry detects a radiation magnitude of 70, which is below the threshold value of 100, and thus the detection circuitry identifies a forcer misalignment condition.

Figure 6A:
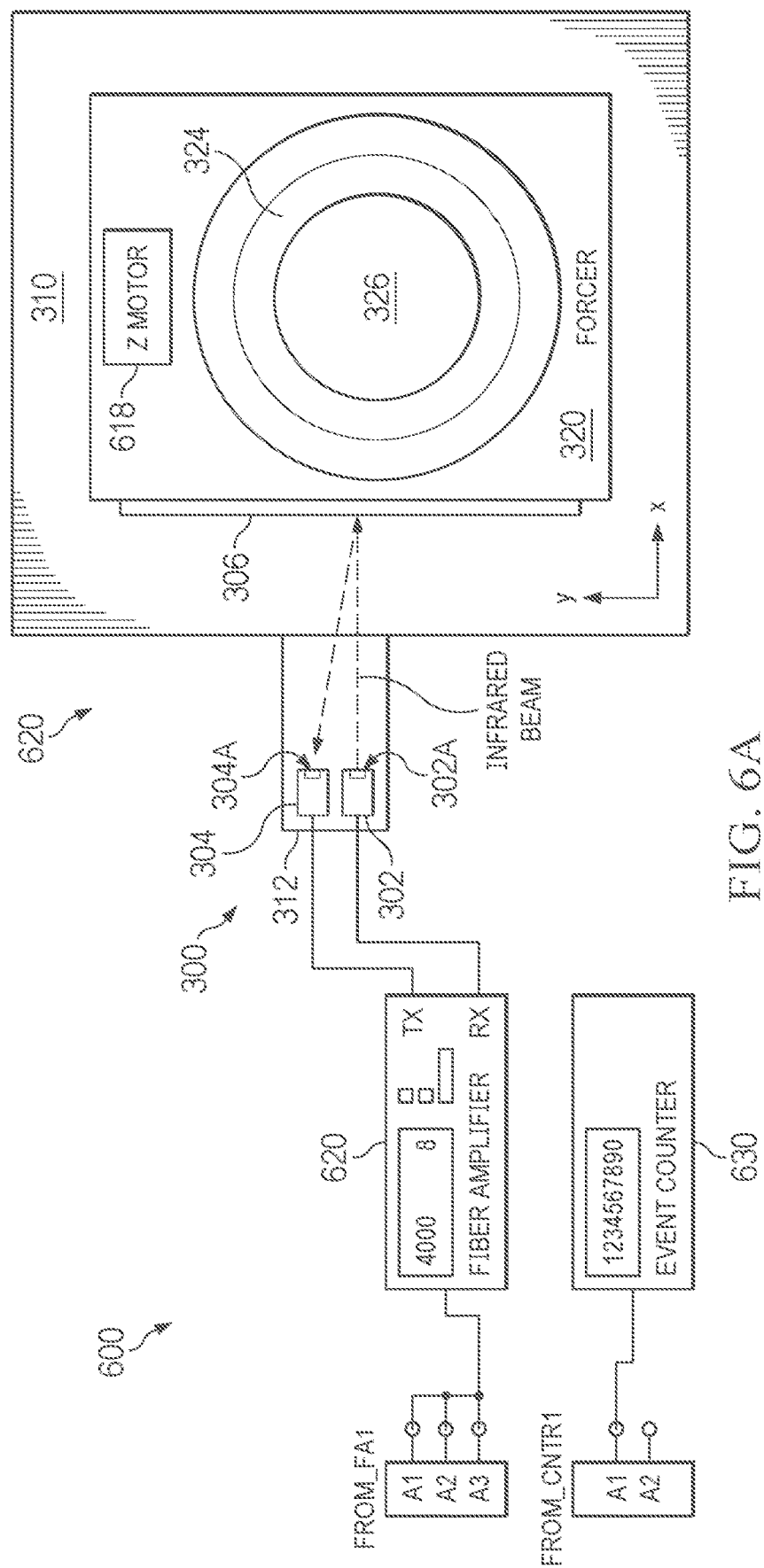
FIGS. 6A-6C illustrate an alignment monitoring system including the example optical sensor system shown in any of FIGS. 2-5D, according to one embodiment of the invention.
Figure 6B:
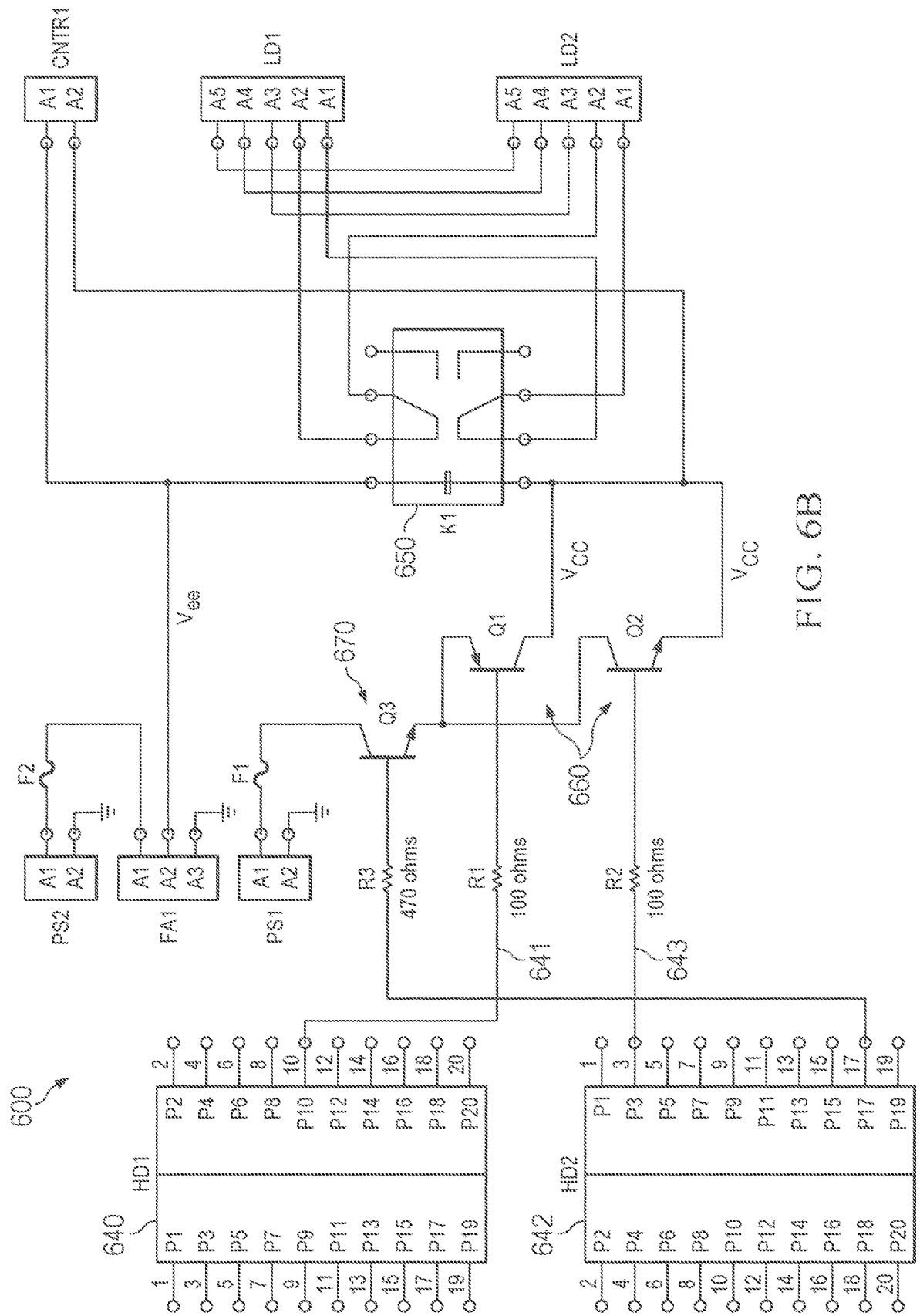
Figure 6C:
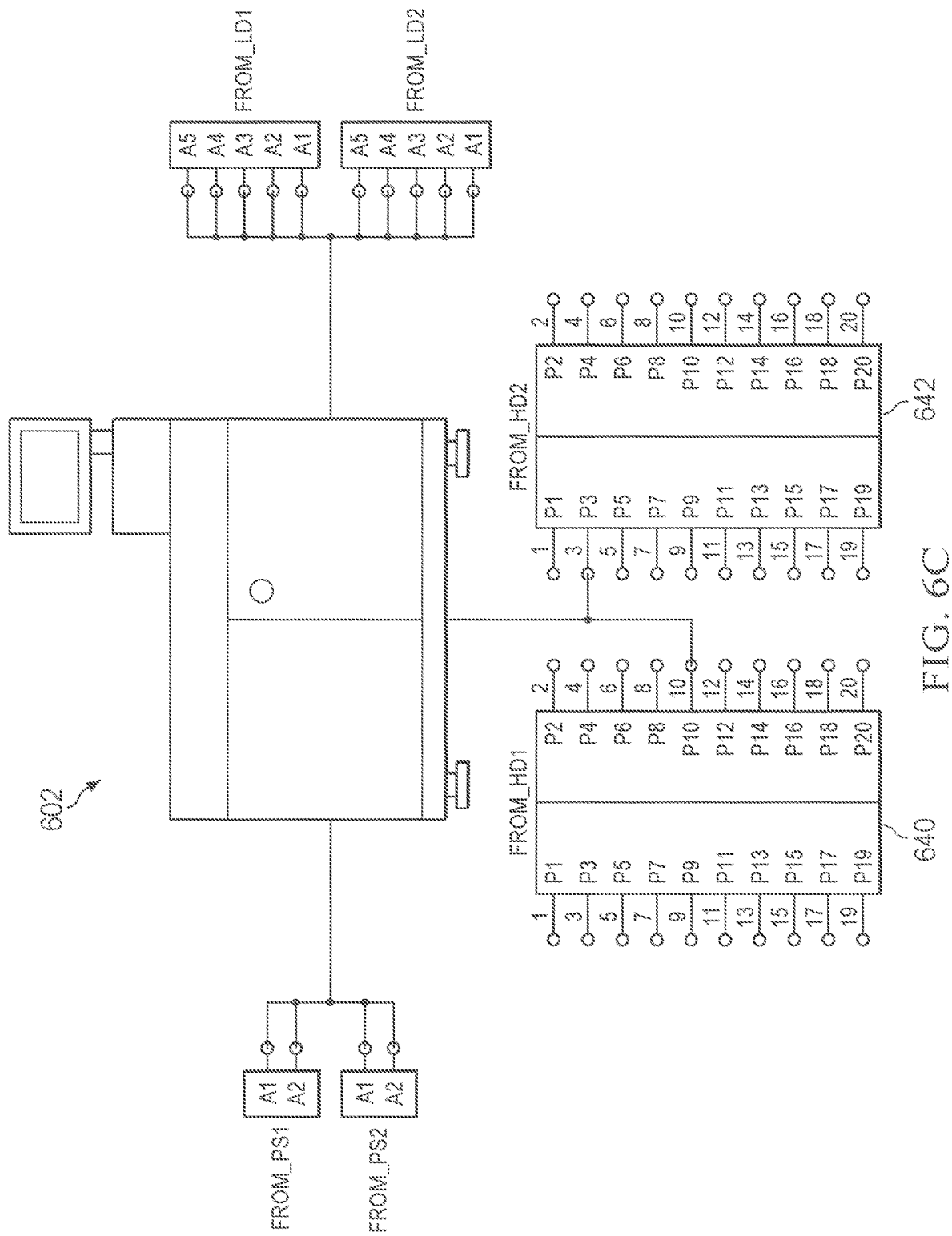

FIGS. 6A-6C illustrate an alignment monitoring system 600 including an example optical sensor system 300, e.g., as shown in any of FIGS. 2-5D, according to one embodiment of the invention. In general, FIG. 6A shows circuitry related to the optical sensor system, FIG. 6B shows circuitry for detecting a forcer misalignment condition, and FIG. 6C shows circuity for controlling the wafer prober, e.g., in response to a detected forcer misalignment condition.

First, FIG. 6A shows a top view of the forcer 320, which carries a chuck assembly 324 for supporting a semiconductor wafer 326 to be tested. During normal operation, the forcer 320 is configured to translate laterally along the x-axis direction and/or y-axis direction relative to the underlying platen 310. In addition, the forcer 320 includes a "z motor" 618 configured to raise and lower the chuck 324 in the z-axis direction, e.g., to bring the wafer into or out of contact with respect testing devices, e.g., probing needles or a probe card.

As shown in FIG. 6A, fiber optic sensor system 300 discussed above includes a fiber optic sensor head 303 including fiber optic transmitter 302 and fiber optic receiver 302, e.g., similar to the example embodiment shown in FIG. 3. As discussed above, the fiber optic sensor head 303 may be mounted at a side of the platen 310 by a mounting structure 312, with the fiber optic transmitter 302 and fiber optic receiver 304 facing the forcer 310 and configured to receive radiation from fiber optic transmitter 302 reflected by mirror strip 306 over the full range of movement of the forcer in the x-y plane. Although the fiber optic transmitter 302 and fiber optic receiver 304 are shown arranged side-by-side along the y-axis (for illustration purposes), fiber optic transmitter 302 and fiber optic receiver 304 may be arranged one on top of the other along with z-axis, as shown in FIG. 3.

The mirror strip 306 may be attached at a base portion of the forcer 306, and provides a target for fiber optic transmitter 302. As discussed above, the planar reflective surface of mirror strip 306 extends parallel with the y-axis, and the fiber optic transmitter 302 is arranged such that a central beam axis of the emitted radiation is exactly perpendicular (normal) or approximately perpendicular (normal) to the planar reflective surface of the mirror strip 306. As discussed above, an advantage of this configuration is that translational movements of the forcer in the x and y directions may cause minimal or relatively small affects at the fiber optic receiver 304, to thereby avoid detecting a forcer misalignment condition during normal operations of the prober (i.e., where the forcer 302 moves in the x and y directions as intended).

The alignment monitoring system 600, including optical sensor system 300, is configured to monitor the physical alignment of the forcer 320 with respect to the platen 310, and detect misalignment of the forcer 320, e.g., due to FLR. For example, as shown in FIGS. 5A-5D discussed above, alignment monitoring system 600 may be configured to identify a rotational misalignment of forcer 320 relative to the platen 310, e.g., based on a rotational movement of forcer 320 around the z-axis.

As discussed above, an transmitter aperture 302A of fiber optic transmitter 302 emits an infrared beam toward mirror strip 306, which reflects the beam (or a portion thereof) back toward fiber optic receiver 304. A portion of the reflected beam is received in a receiver aperture 304A of fiber optic receiver 304, and relayed to a radiation detector and analyzer 620. The radiation detector and analyzer 620 may include an amplifier and any other suitable electronics to covert the received radiation to an electrical signal, convert the electrical signal to a value representing a measured quantity (magnitude) of the received radiation, and compare the measured radiation magnitude value to at least one threshold value to identify a radiation magnitude that may indicate a forcer misalignment condition, referred to herein as a "received radiation anomaly." For example, radiation detector and analyzer 620 may identify a received radiation anomaly if the measured radiation magnitude value falls below a defined threshold value. Radiation detector and analyzer 620 may output a signal indicating the presence or absence of a forcer misalignment condition to a load relay 650 shown in FIG. 6B, via an interface indicated at "FA1." In one embodiment, the radiation detector and analyzer 620 applies a $V_{ee}$ source voltage at the load relay 650 via the FA1 interface when a received radiation anomaly is detected, and otherwise applies no voltage on FA1.

As discussed below, the load relay 650 may identify a forcer misalignment condition upon the detection of both (a) signaling from the radiation detector and analyzer 620 indicating a received radiation anomaly (e.g., $V_{ee}$ source voltage applied via FA1 as discussed above) and (b) signaling from forcer control circuity indicating a current movement of the forcer 320 or chuck 324 in one or more predefined directions, e.g., x-axis and/or y-axis movement of forcer 320, or z-axis up or down movement of the chuck assembly 324. In other embodiments, the alignment monitoring system 600 may identify a forcer misalignment condition upon each received radiation anomaly by the radiation detector and analyzer 620, regardless of the current movement of the forcer 320 or other condition.

As shown in FIG. 6A, the alignment monitoring system 600 may also include an event counter 630 configured to count the number of forcer misalignment condition events detected by system 600. The event counter 630 may be signaled by the load relay 650 upon each detected instance of a forcer misalignment condition, e.g., via the interface indicated at "CNTR 1."

FIG. 6B shows additional circuitry of alignment monitoring system 600, including the load relay 650 discussed above and power supplies for the alignment monitoring system 600. The alignment monitoring system 600 may be powered by two DC voltage levels: (1) a +5 volts $V_{cc}$ for internal circuit components (indicated at PS1) and (2) a +12 volts $V_{cc}$ for powering the radiation detector and analyzer 620 (indicated at PS2). Both power supplies may be tied to a common ground.

In the illustrated embodiment, the load relay 650 comprises a non-latching double-pole double-throw (DPDT) relay, which is in a normally closed (NC) position. The non-latching DPDT load relay 650 is opened by triggering signals received at the relay 650 to complete the load relay coil power of the load relay 650. When opened, load relay 650 sends an error signal to the control electronics of prober 602, which suspends operations upon receiving the error signal.

In this example embodiment, relay 650 may be opened by receiving both (a) a $V_{ee}$ signal from the radiation detector and analyzer 620 (via FA1) indicating a received radiation anomaly detected by the radiation detector and analyzer 620 and (b) either (i) a forcer drive signal 641 (e.g., defined voltage) from a forcer driver board 640 indicating y-axis movement of forcer 320 or (ii) a chuck drive signal 643 (e.g., defined voltage) from a chuck driver board 642 indicating a z-axis (up/down) movement of the chuck 324.

In one embodiment, (a) the forcer drive signal 641 is an active high pulse from the forcer A2 motion control driver board 640 for driving the forcer 320 in the x- and y-axis directions (i.e., lateral movement), which voltage is present only during x or y axis movement of the forcer 320, and (b) the chuck drive signal 643 is an active low pulse taken from a prober A911 theta-Z driver board 642 for driving the z-axis motor of the chuck assembly for raising and lowering the wafer, which is a bidirectional z-axis power voltage that is present only during z-axis (up or down) movement of the chuck 324. These signals(s) are then fed to switching transistors Q1 and Q2 (indicated at 660) in the controller circuit. The output of switching transistors Q1 and Q2 provides a $V_{cc}$ source voltage to the non-latching load relay 650.

Once the load relay 650 is activated, its contact switches swing to open, thus creating an open path for the prober error signal. The prober 602 is configured to detect the open path immediately and put the forcer 320 in an error state, which halts all movement of the forcer 320 and moves the chuck 324 to a lowered position. When the prober 602 stops operation due to such error detection, $V_{cc}$ provided by the forcer drive signal 641 and/or chuck drive signal 643 drops to zero, and the coil power of the load relay 650 is terminated and returns to its normally-closed condition. An operator may then blank (disable power to) the forcer coil, manually reposition and re-align the forcer 320 over the platen 310, e.g., in the home position of the forcer 320, and unblank (restore power to) the forcer coil, which may magnetically lock the forcer 320 into position. Once the forcer 320 is re-aligned and unblanked, the controller circuit automatically resets itself to monitor for the next forcer misalignment event.

In addition, the example alignment monitoring system 600 includes a switching transistor Q3 (indicated at 670), which serves as a main power on/off switch for transistors Q1 and Q2, and may be configured to turn these transistors OFF during prober boot up and initialization, e.g., to prevent prober initialization error causing the prober to hang-up.

When the prober needs to be powered down and then powered up, initialization will follow. The initialization process includes movement of chuck 324 up/down, which outputs a $V_{cc}$ signal to switching transistor Q1 only. If the forcer 320 is in a rotational misalignment during initialization, the radiation detector and analyzer 620 will also output a signal $V_{ee}$. In this scenario, the load relay 650 is activated (i.e., detects a forcer misalignment condition) and places the prober in an error condition that may interrupt the prober initialization process and cause the prober to hang-up. Thus, to avoid this situation, the main power switching transistor Q3 may be configured to turn off the switching transistors Q1 and Q2 during prober initialization, such that a $V_{cc}$ signal is not sent to load relay 650, thus preventing the load relay 650 from activating during prober initialization.

In one embodiment, switching transistor Q3 takes its base signal from a blank/unblank status of the forcer 320. During prober initialization, the forcer 320 is in a blank state and provides no +5Vs on pin 17 of chuck driver board 642. This holds switching transistor Q3 in an unsaturated (electrically OFF) state. After successful initialization of the prober, the forcer 320 can then be unblanked by the operator. When the forcer 320 is unblanked, +5V is applied on pin 17 of chuck driver board 642, which places switching transistor Q3 in a saturated (electrically ON) state, providing a power path to switching transistors Q1 and Q2.

Figure 7:
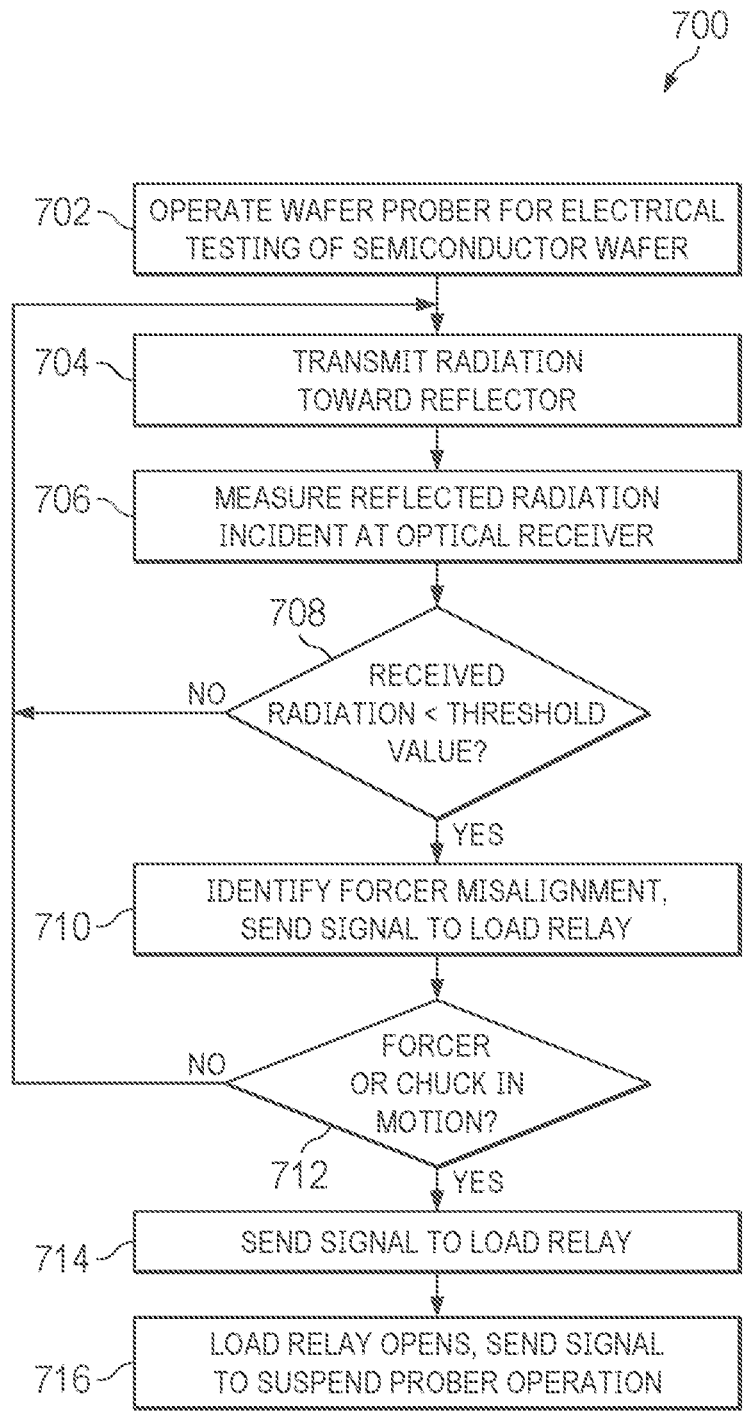
FIG. 7 illustrates an example method for monitoring for a forcer misalignment, according to one example embodiment.

FIG. 7 illustrates an example method 700 for monitoring for a forcer misalignment, according to one example embodiment. At 702, a wafer prober may be operated to perform electrical testing of a semiconductor wafer. At 704, a transmitter 302 of an optical sensor system emits a radiation beam toward a reflector 316, which reflects at least a portion of the radiation toward a receiver 304, e.g., as discussed above. At 706, a radiation detector and analyzer 620 measures a quantity of incident radiation received at the receiver 304. At 708, the radiation detector and analyzer 620 may compare the measured received radiation with a threshold value. If the received radiation is above the threshold value, indicating the forcer 320 is sufficiently aligned with the platen 310 (or other reference structure), the method returns to 704 to continue monitoring.

However, if the received radiation is below the threshold value, a forcer misalignment is identified at 710, and the radiation detector and analyzer 620 sends a signal (e.g., Vee) to a load relay 650. As indicated at 712, if neither the forcer 320 nor chuck 324 is currently being driven (e.g., based on signals from a forcer drive board 640 and/or chuck driver board 642), an error condition is not triggered, and the method may return to 704 to continue monitoring. However, if forcer 320 or chuck 324 is currently being driven, e.g., based on signals from a forcer drive board 640 and/or chuck driver board 642, the relevant driver board(s) send respective signals 641, 643, which generates a signal Vcc sent to the load relay 650, as indicated at 714. At 716, the load relay 650 opens upon receiving both signals Vee and Vcc, and sends an appropriate signal to the prober control electronics to suspend operation of the prober (e.g., interrupting any movement of the chuck 324 and driver 320) and display an error notification to an operator via a display device.

The invention claimed is:

1. A system for monitoring a wafer prober used for electrical testing of a semiconductor wafer, the system comprising:
    an optical sensor system to monitor an alignment of a forcer of the wafer prober, the forcer being moveably arranged on a platen for commanded linear translational movements of the forcer relative to the platen during a normal operation of the wafer prober; and
    the optical sensor system comprising:
        a transmitter and a receiver both positionally affixed to one of (a) the forcer or (b) the platen; and
        a reflector positionally affixed to the other one of (a) the forcer or (b) the platen;
        the transmitter to transmit radiation toward the reflector; and
        the receiver to:
            receive reflected radiation from the reflector, the reflected radiation comprising at least a portion of the radiation transmitted by the transmitter and reflected by the reflector; and
            generate output signal signals indicating the reflected radiation received at the receiver;
    alignment monitoring circuitry to:
        compare the output signals to at least one threshold value to identify rotational misalignments of the forcer relative to the platen;
            wherein a comparison of first output signals associated with the commanded linear translational movements of the forcer relative to the platen to the at least one threshold value do not cause an identification of a forcer misalignment condition; and
            wherein a comparison of second output signals associated with a non-commanded rotational movement of the forcer relative to the platen to the at least one threshold value cause an identification of a forcer misalignment condition; and
        output an alert signal in response to the identification of the forcer misalignment condition caused by the non-commanded rotational movement of the forcer.

2. The system of claim 1, wherein the alignment monitoring circuitry to control a display device to display an alert notification in response to the alert signal output by the alignment monitoring circuitry.

3. The system of claim 1, wherein the alignment monitoring circuitry to suspend an operation of the wafer prober in response to the alert signal output by the alignment monitoring circuitry.

4. The system of claim 1, wherein:
    the wafer prober comprises a chuck assembly to hold the semiconductor wafer; and
    the alignment monitoring circuitry to suspend a vertical movement of a chuck operation of the wafer prober in response to the alert signal output by the alignment monitoring circuitry.

5. The system of claim 1, wherein:
    the reflector of the optical sensor system is positionally affixed to the forcer; and
    the transmitter and receiver of the optical sensor system are positionally affixed to the platen.

6. The system of claim 1, wherein:
    the reflector of the optical sensor system is positionally affixed to the platen; and the transmitter and receiver of the optical sensor system are positionally affixed to the forcer.

7. The system of claim 1, wherein:
the forcer carries a chuck assembly that supports the semiconductor wafer; and
the alignment monitoring circuitry comprises a relay to generate the alert signal as a function of (a) the second output signals generated by the receiver of the optical sensor system and (b) control signals indicating a controlled movement of the forcer or chuck assembly.

8. The system of claim 1, the transmitter of the optical sensor system to transmit an infrared beam.

9. The system of claim 1, wherein the transmitter of the optical sensor system comprises a laser diode to emit laser radiation.

10. The system of claim 1, wherein each of the transmitter and the receiver of the optical sensor system is provided at an end of a respective optical fiber.

11. The system of claim 1, wherein the reflector comprises a planar mirror or other planar reflector.

12. A method for monitoring a wafer prober used for electrical testing of a semiconductor wafer, the method comprising:
operating the wafer prober for electrical testing of the semiconductor wafer, wherein operating the wafer prober includes performing commanded linear translational movements of a forcer, which supports the semiconductor wafer, relative to a platen to position the semiconductor wafer relative to a testing device for performing electrical tests on the semiconductor wafer;
wherein a transmitter and a receiver of an optical sensor system are positionally affixed to one of the forcer and the platen, and a reflector is positionally affixed to the other of one the forcer and the platen;
during operation of the wafer prober, emitting radiation from the transmitter toward the reflector;
receiving reflected radiation at the receiver, the reflected radiation comprising at least a portion of the radiation transmitted by the transmitter and reflected by the reflector;
generating output signal signals, by the receiver of the optical sensor system, indicating the reflected radiation received at the receiver;
monitoring an alignment of the forcer relative to the platen based on the output signal generated by the receiver of the optical sensor system;
identifying a misalignment of the forcer relative to the platen based on first output signals associated with a non-commanded rotational movement of the forcer relative to the platen, and not identifying a misalignment of the forcer relative to the platen based on second output signals associated with the commanded linear translational movements of the forcer relative to the platen; and
outputting an alert signal in response to identifying the misalignment of the forcer based on the first output signals associated with the non-commanded rotational movement of the forcer relative to the plate.

13. The method of claim 12, further comprising controlling a display device to display an alert notification in response to the alert signal output by the alignment monitoring circuitry.

14. The method of claim 12, further comprising automatically suspending an operation of the wafer prober in response to the alert signal output by the alignment monitoring circuitry.

15. The method of claim 12, wherein the forcer carries a chuck assembly that supports the semiconductor wafer.

16. The method of claim 15, wherein the method comprises automatically suspending a vertical movement of a chuck operation of the wafer prober in response to the alert signal output by the alignment monitoring circuitry.

* * * * *